(12) United States Patent
Lehane et al.

(10) Patent No.: US 10,908,184 B2
(45) Date of Patent: Feb. 2, 2021

(54) REAL TIME TRIGGER USING A FINITE STATE MACHINE HAVING A COUNTING STATE

(71) Applicant: Keysight Technologies, Inc., Santa Rosa, CA (US)

(72) Inventors: Andrew Lehane, Milnathort (GB); Antony J. A. Kirkham, Edinburgh (GB)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/248,642

(22) Filed: Jan. 15, 2019

(65) Prior Publication Data

US 2019/0146439 A1    May 16, 2019

Related U.S. Application Data

(63) Continuation of application No. 14/578,198, filed on Dec. 19, 2014, now abandoned.

(51) Int. Cl.
G05B 19/045   (2006.01)
G01R 13/02    (2006.01)

(52) U.S. Cl.
CPC ............... *G01R 13/0254* (2013.01); *G05B 2219/23289* (2013.01)

(58) Field of Classification Search
CPC ...... G01R 13/0254; G05B 2219/23289; G05B 19/045; G05B 2219/13009
See application file for complete search history.

(56) References Cited

U.S. PATENT DOCUMENTS

| | | |
|---|---|---|
| 4,858,142 A | 8/1989 | Jenq |
| 5,201,395 A | 8/1993 | Takizawa |
| 5,265,004 A | 11/1993 | Schultz |

(Continued)

FOREIGN PATENT DOCUMENTS

| | | |
|---|---|---|
| CN | 1710429 A | 12/2005 |
| CN | 101174261 A | 5/2008 |

(Continued)

OTHER PUBLICATIONS https://cs.stanford.edu/people/eroberts/courses/soco/projects/2004-05/automata-theory/basics.html (Year: 2004).*

(Continued)

*Primary Examiner* — Seokjin Kim

(57) ABSTRACT

An apparatus that searches for a pattern in a signal is disclosed. The apparatus can be used to implement a real time trigger in an instrument such as a high speed oscilloscope. The apparatus includes a symbol generator and a finite state machine (FSM). The symbol generator receives an ordered sequence of signal values and converts the ordered sequence of signal values into an ordered sequence of symbols, each symbol having a plurality of states. The FSM receives the ordered sequence of symbols and generates a match signal if the ordered sequence of symbols includes a target sequence specified by a regular expression that includes a counting limitation on one of the symbol states. The FSM includes a counting state that includes a counter that counts instances of the one of the symbol states.

20 Claims, 8 Drawing Sheets

(56) References Cited

U.S. PATENT DOCUMENTS

| | | | |
|---|---|---|---|
| 5,473,531 A * | 12/1995 | Flora-Holmquist | ........................ G05B 19/042 700/12 |
| 5,857,980 A | 1/1999 | Wilson | |
| 6,473,701 B1 | 10/2002 | Tallman | |
| 7,133,463 B1 | 11/2006 | Amirkhany | |
| 7,277,506 B1 * | 10/2007 | Pope | ................. H04L 25/03197 375/341 |
| 8,732,435 B1 | 5/2014 | Chou | |
| 9,268,321 B2 | 2/2016 | Lehane | |
| 9,618,923 B2 | 4/2017 | Lehane | |
| 9,874,863 B2 * | 1/2018 | Barford | ................ G05B 19/045 |
| 10,037,689 B2 | 7/2018 | Taylor | |
| 2003/0210487 A1 | 11/2003 | Oda | |
| 2005/0134307 A1 | 6/2005 | Stojanovic | |
| 2006/0106317 A1 | 5/2006 | McConnell | |
| 2007/0200550 A1 * | 8/2007 | Corredoura | ........ G01R 13/0254 324/121 R |
| 2007/0282573 A1 * | 12/2007 | Fritz | ........................ G06F 40/14 703/2 |
| 2008/0273636 A1 | 11/2008 | Zhu | |
| 2009/0077404 A1 | 3/2009 | Herring | |
| 2010/0100518 A1 | 4/2010 | Andrade | |
| 2011/0134979 A1 * | 6/2011 | Rule | ................. G01R 13/0254 375/224 |
| 2013/0085583 A1 | 4/2013 | Neidig | |
| 2014/0232582 A1 | 8/2014 | Lian | |
| 2014/0370833 A1 | 12/2014 | Din | |
| 2015/0057978 A1 | 2/2015 | Rule | |
| 2015/0370234 A1 * | 12/2015 | Lehane | ............... H03M 1/1245 326/46 |
| 2017/0031159 A1 | 2/2017 | Pugh | |
| 2017/0031336 A1 | 2/2017 | Lehane | |

FOREIGN PATENT DOCUMENTS

| | | |
|---|---|---|
| CN | 101877682 A | 11/2010 |
| CN | 103034134 A | 4/2013 |
| CN | 103270468 A | 8/2013 |
| WO | 0215405 A2 | 2/2002 |
| WO | 2012088130 A2 | 6/2012 |

OTHER PUBLICATIONS

14578198 Patent Board Decision (Year: 2018).*
Office Action dated Sep. 29, 2018, China Application No. 201510355067.1.
Nonfinal office action dated Oct. 7, 2016, U.S. Appl. No. 14/815,249.
Final office action dated Sep. 15, 2016, U.S. Appl. No. 14/578,198.
Final office action dated May 5, 2017, U.S. Appl. No. 14/815,249.
Nonfinal office action dated Apr. 5, 2018, U.S. Appl. No. 14/815,249.
Nonfinal office action dated Jul. 15, 2016, U.S. Appl. No. 14/957,491.
Notice of Allowance dated Oct. 2, 2015, U.S. Appl. No. 14/313,884.
Nonfinal office action dated Mar. 23, 2016, U.S. Appl. No. 14/578,198.
Notice of Publication, Dec. 28, 2015, U.S. Appl. No. 14/313,884.
Notice of Publication, Jun. 23, 2016, U.S. Appl. No. 14/578,198.
Notice of Allowance dated Nov. 4, 2016, U.S. Appl. No. 14/957,491.
Notice of Publication, Mar. 24, 2016, U.S. Appl. No. 14/957,491.
Nonfinal office action dated Feb. 7, 2019, U.S. Appl. No. 14/815,249.
Notice of Allowance dated Apr. 24, 2019, China Application No. 201510355067.1.
China Office Action, Application No. 201510959333.1, dated Jun. 14, 2019.
Notification of Decision to Grant dated Apr. 20, 2020, China Application No. 201510959333.1

* cited by examiner

REAL TIME TRIGGER USING A FINITE STATE MACHINE HAVING A COUNTING STATE

CROSS-REFERENCE TO RELATED PATENT APPLICATIONS

This application is a continuation under 35 U.S.C. § 111 of U.S. patent application Ser. No. 14/578,198 filed on Dec. 19, 2014, said patent application being incorporated by reference herein.

BACKGROUND

Measurement instruments that measure, record, process a signal, and display the results of the processing are known to the art. For example, a digital oscilloscope measures the amplitude of a signal as a function of time and displays a portion of the observed signal as a graph of signal amplitude as a function of time. Modern digital oscilloscopes can measure a signal at a rate of close to 100 Gigasamples/second in each of a plurality of measurement channels. To generate data at this rate, the signal is typically digitized using a bank of sample and hold circuits that sample the signal in successive time slots. Each sample and hold circuit feeds a high speed analog-to-digital converter (ADC) that stores its output in a high speed memory bank that is assigned to that ADC.

Only a small fraction of this data is typically of interest. Hence, some form of "trigger" is utilized to define the beginning of a region of interest in the signal. When the trigger is detected, the instrument records the signal from the trigger to some point in time that depends on the storage capacity of the memory banks. Simple triggers such as detecting a rising edge in the signal can be implemented in hardware in real time. A trigger system that can consume samples as fast as the bank of ADCs can generate the samples will be referred to as a real time trigger system. However, more complex triggers must rely on storing a data sequence and then examining the sequence using hardware that is too slow to operate in real time. In such schemes, a real time trigger is used to define some preliminary trigger event. The instrument then records the data from that trigger point to some predetermined number of samples. The recorded data is then examined by a more complex trigger system to determine if the more complex trigger is present. Such secondary trigger systems are referred to as post acquisition triggers (PATs). If the complex trigger is found, the instrument displays the data starting with that trigger. If the complex trigger pattern is not found, the process is repeated. During the time the PAT is operating on the stored data, the instrument is not acquiring any new data, and hence, the instrument is "blind" for that period of time. The blind time is typically a large fraction of the total operating time, and hence, a signal of interest can be lost.

In co-pending US patent application U.S. Ser. No. 14/313, 884, a scheme for using finite state machines (FSMs) to implement a trigger system for complex trigger criteria is disclosed. In that invention, the digitized signal values are first converted to a sequence of symbols that have much fewer states than the digitized signal values. For example, a 12 bit ADC-generated value can be reduced to three symbols, L, M, and H by comparing the signal values to three ranges of values. A trigger is defined as a sequence in the symbol sequence that satisfies a predetermined regular expression. The FSM-implemented trigger system operates on the resultant sequence of symbols. Many triggers of interest can be expressed as patterns on these symbols. Since the number of states is small, the memory requirements for the resultant FSM are significantly reduced. To achieve real time processing speeds, FSMs that operate on words having a plurality of symbols in each word are used, so that the number of symbols consumed in each clock cycle matches the rate at which the symbols are generated by the ADCs. Even in systems in which the rate of consumption is less that that required for real time processing, the processing time can be reduced from that associated with PATs, and hence, the blind time is significantly reduced. Triggering systems that implement triggers in which the trigger pattern is specified in terms of the time a symbol is repeated present significant challenges. The present invention is directed to systems for implementing such triggers.

SUMMARY OF THE INVENTION

The present invention includes an apparatus that searches for a pattern in a signal. The apparatus includes a symbol generator and an FSM. The symbol generator receives an ordered sequence of signal values and converts the ordered sequence of signal values into an ordered sequence of symbols, each symbol having a plurality of states. The FSM receives the ordered sequence of symbols and generates a match signal if the ordered sequence of symbols includes a target sequence specified by a regular expression that includes a counting limitation on one of the symbol states. The FSM includes a counting state that includes a counter that counts instances of the one of the symbol states.

In one aspect of the invention, the FSM is characterized by an input word and an FSM clock period. The FSM processes one input word during each FSM clock period, and the input words includes a plurality of the symbols.

In another aspect of the invention, the counting limitation includes a requirement that a precise number of instances of one of the symbol states be present in the target sequence. In yet another aspect of the invention, the counting limitation includes a requirement that more than a specified number of instances of one of the symbol states be present in the target sequence. In a still further aspect of the invention, the counting limitation includes a requirement that more than a first specified number of the instances of one of the symbol states and less than a second specified number of the instances of the one of the symbols be present in the target sequence.

In another aspect of the invention, the FSM has a memory that stores a state table that specifies a next state for the FSM based on a present state for the FSM, and the input word currently is processed by the FSM. The state table specifies first and second next states for the FSM when the FSM is in the counting state. The FSM chooses one of the first and second next states based on whether the counting limitation has been satisfied. In a further aspect of the invention, the counting limitation is not satisfied if the counter has a value less than a first value or greater than a second value, and the one of the first and second states that the FSM chooses also depends on whether the counter is less than the first value or greater than the second value.

In yet another aspect of the invention, the apparatus also includes a signal digitizer and a signal memory, the signal generator receiving a signal and generating the ordered sequence of signal values therefrom. The ordered sequence of signal values is stored in the signal memory. In one aspect of the invention, the signal digitizer generates a first number of signal values during each FSM clock period, each of the first number of signal values being converted to a corresponding symbol during one FSM clock period. The FSM processes the first number of symbols as a single input word during one FSM clock period.

In a still further aspect of the invention, the apparatus includes a display controller and a display, the display controller displaying a portion of the signal values on the display in response to the FSM generating the match signal.

In yet another aspect of the invention, the FSM is a Mealy FSM.

DETAILED DESCRIPTION OF THE PREFERRED EMBODIMENTS OF THE INVENTION

Figure 1:
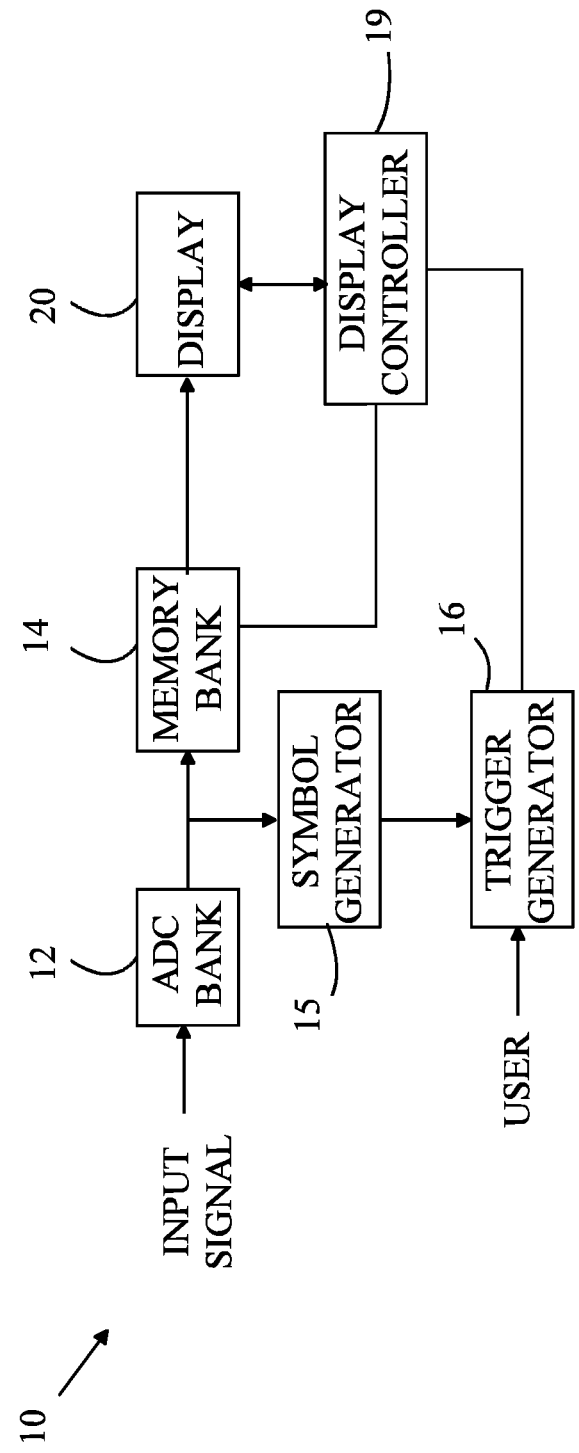
FIG. 1 illustrates a digital oscilloscope system that utilizes an FSM-based trigger system to implement a real time trigger.

The manner in which the present invention provides its advantages can be more easily understood with respect to an exemplary system that utilizes a trigger system based on the symbol system discussed above. Refer now to FIG. 1, which illustrates a digital oscilloscope system that utilizes an FSM-based trigger system to implement a real time trigger (RTT). The input to digital oscilloscope 10 is digitized by a bank of ADCs 12. To provide sufficient time resolution, each ADC includes a sample and hold circuit that has a very narrow sampling window. The window is much shorter than the time needed to digitize the captured sample value. Hence, a bank of ADCs is utilized in which successive ADCs in the bank capture signal values that are displaced in time from one another so as to provide a continuous series of samples separated by the width of the sampling window in time.

The output from each ADC is stored in a corresponding memory bank in memory 14. The details of the banking of the ADCs and the banks in the memory have been omitted from the drawing to simplify the drawing and following discussion. The ADC output is monitored by a symbol generator 15 that generates a symbol from each ADC measurement. The symbols are then inputted to trigger generator 16. If trigger generator 16 finds a match to the trigger sequence, display controller 19 displays the corresponding ADC measurements on display 20 starting from a point defined by the trigger sequence.

To simplify the following discussion, it will be assumed that each input signal value is converted to a symbol set having only three states, L, M, and H. A signal value that is less than a first threshold value is assigned the symbol L; a signal value that is between the first threshold and less than or equal to a second threshold is assigned the symbol M, and signal values that are greater than the second threshold are assigned the symbol H.

The trigger patterns that can be defined in the present invention are limited to patterns that can be defined by regular expressions. For the purposes of the present discussion, a regular expression is defined to be a sequence of characters that defines a search pattern. Given a regular expression, an FSM that executes the search so defined exists, and there are procedures for automatically generating that FSM. It should also be noted that there is more than one FSM that is capable of performing the search for any given regular expression.

An FSM is a machine that has a plurality of states connected by "directed edges". At each processing cycle, the FSM moves from its current state to a next state when a new input word is received by the FSM. Hence, each edge has one or more input values associated with that edge. When the FSM receives an input word having a value equal to the value corresponding to an edge, and the FSM is in the state associated with the input side of the edge, the FSM changes to the state associated with the output side of the edge. The FSM then proceeds to process the next input word. Certain transitions give rise to the FSM reporting a match that includes information associated with the transition. The transition may be the entry into a particular state or the entry into that state by a specified edge. For the purposes of the present discussion, the processing cycle is complete when the FSM has moved to its new state and made any required reports.

As noted above, a regular expression is defined to be a sequence of characters that defines a search pattern. Each character in the expression is either a regular character with its literal meaning or one of a predetermined number of metacharacters that have a special meaning. For example, the metacharacter "|" denotes an alternative. The regular expression "a|b" is satisfied by a or b. The metacharacters "?", "*", and "+" quantify the preceding element. Metacharacter "?" is satisfied if the preceding element occurs zero or one time, "*" is satisfied if the preceding element occurs zero or more times, and "+" is satisfied if the preceding element occurs one or more times. Many patterns of interest require the repetition of some string. The expression that is to be repeated is surrounded (grouped) by ( ) if there is more than one character, or more than one character range in the expression. Metacharacters "[" and "]" are used to create character classes, such as [LMH], "^" is used to represent negation, i.e., [^L], everything but 1'. To specify that the expression is to be repeated m times, {m} is used after the expression. To specify an expression that is to be repeated at least m times, {m,} is used after the expression. To specify a range between n and m, the expression is followed by {m,n}.

In terms of this notation, a regular expression for a rising edge is "L+M*H", i.e., one or more Ls followed by zero or more Ms followed by an H. Similarly, a regular expression for a falling edge is "H+M*L". A regular expression for either a rising or falling edge is (H+M*L)|(L+M*H). Additional features of interest in defining trigger sequences are state transitions, glitches, and runt pulses. A state transition occurs when the waveform, having been established in one of the logic states, switches to the other state and becomes established there. A glitch occurs when the waveform, having been established in one logic state, switches to the other state, but not long enough to be considered established. A runt pulse occurs when the waveform, having been established in one logic state, moves into the indeterminate region but then returns to the first logic state without ever having crossed the other logic state threshold.

One challenge that must be overcome to provide practical triggers using FSMs is creating space efficient counters for use in the triggers. For example, a glitch trigger, must only trigger when the width of the pulse is less than a certain time. Similarly, an edge followed by a second edge should only trigger when the time between the edges is greater than a predetermined time. In a digital oscilloscope, or other similar instruments based upon ADCs, the amount of time passed between events of interest is equivalent to the number of samples. For example, at 1 Gigasample/second, a sample is generated every nanosecond, and hence, the passage of time is equivalent to counting the number of samples.

Figure 2:
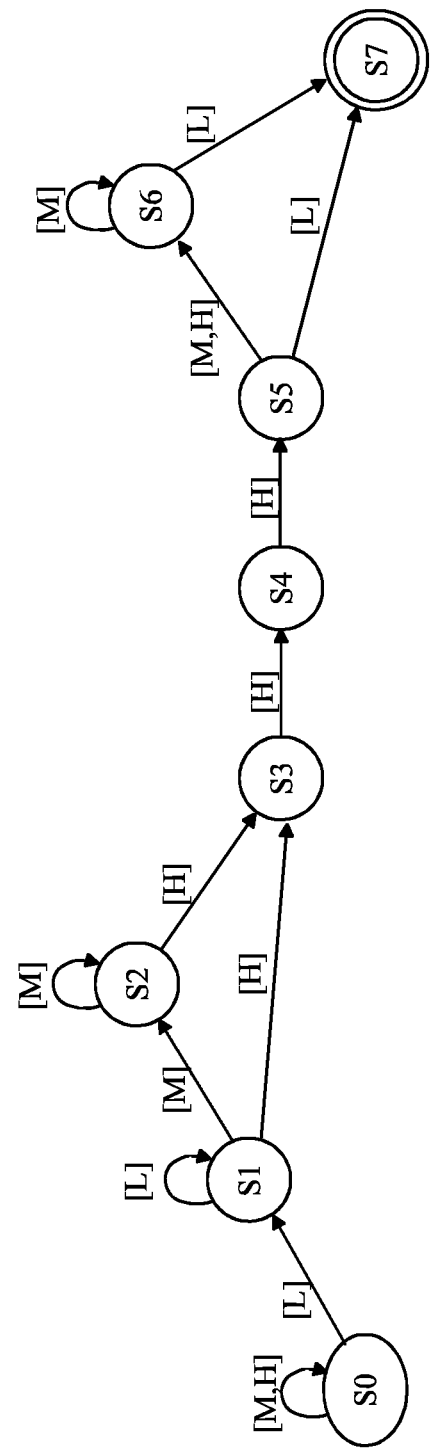
FIG. 2 illustrates an FSM that searches for regular expression [^L]*L+M*H{3,4}M*L.

For example, a glitch trigger can be defined by the regular expression [^L]*L+M*H{3,4}M*L. That is, zero or more symbols that are not L, i.e., M or H, followed by one or more L followed by zero or more M, followed by between three and four Hs followed by zero or more Ms and an L. Refer now to FIG. 2, which illustrates an FSM that searches for this regular expression. The final reporting state is indicated by the double circle around the state. In this example, the counting feature is implemented by inserting additional states into the FSM, namely states S3-S5. This is a viable approach for small values of the counter. At 1 Gigasample/second, this FSM will trigger on a glitch having a width between 3 ns and 4 ns. However, this approach is not efficient when the count is significantly larger. For example, a glitch that is defined as being in the high state for a microsecond would require a thousand states.

A second problem relates to the need to match the processing rate of the trigger generator to the rate at which the input signal is being sampled and digitized. Consider a system in which samples are digitized at a rate of 6.4 Gigasamples/second. An FSM implemented in a programmable gate array is limited to running at a clock rate of 400 MHz. Hence, the FSM must operate on an input word that is 16 samples wide to keep up with the ADC bank. Counting symbols presents significant challenges when the word size processed by the FSM is large. A wide word FSM must be able to recognize data changes at any alignment in the incoming data. For simplicity, consider a four word system where four symbols arrive on each FSM clock edge. Consider the regular expression discussed above for a glitch that is required to count H symbols. The FSM must be able to detect the sequence of Hs independent of the alignment of the symbols in the four-symbol input word. That is, the input word that commences a string of Hs could be 'LMMH' followed by four words of 'HHHH' followed by 'HMML', i.e., 18 'H' symbols. However, the same sequence could arrive on a different word boundary such as 'LMHH' then four lots of 'HHHH' then 'MMML'. This is also 18 'H' symbols but on a different alignment. Hence, any mechanism for counting a symbol must deal with all of the possible alignments of the symbol sequence within the multi-symbol input words.

A third problem that must be overcome with multiple symbol input words is the need to count samples, not FSM clock cycles. If the word size is one and the FSM consumes one symbol per clock cycle, then counting clock cycles of the FSM is equivalent to counting samples. When the number of symbols per FSM clock cycle is greater than one, counting FSM clock cycles is equivalent to counting multiple samples.

A fourth problem that must be overcome is the need for the FSM to consume a multi-symbol word every FSM clock cycle. Hence, the hardware cannot take two or more clock cycles to make a transition. The FSM must be able to calculate the next state in a single FSM clock cycle and on each and every subsequent FSM clock cycle.

Finally, the counting hardware must support the different styles of counters. There are three fundamentally different styles of counting in regular expressions.
1. {m} match exactly m times
2. {m,} match at least m times
3. {m,n} match at least m times but no more than n times The first problem can be solved by using an extended FSM that includes a counting function associated with one or more states. Such states will be referred to as counting states in the present discussion. Each counting state has a counter associated with that state. The counter is reset to a particular value when the FSM enters that counting state. The count is incremented or decremented each time a particular input word is input to the FSM when the FSM is in that counting state. The choice of the next state executed by the FSM upon receiving a particular input word when the FSM is in the counting state depends on the count in the counter at the time the input word is received. In general, there will be one set of edges leaving the counting state if the count satisfies a predetermined condition, and there will be another set of edges corresponding to the case in which the count does not satisfy this condition. In the following discussion, the predetermined condition will be referred to as the count satisfied condition.

To simplify the following discussion, each of the counting styles discussed above will be discussed with reference to FSMs in which only one symbol is processed at each FSM clock cycle. The manner in which these FSMs can be utilized to define an FSM for a multi-symbol input word will then be discussed.

Figure 3A:
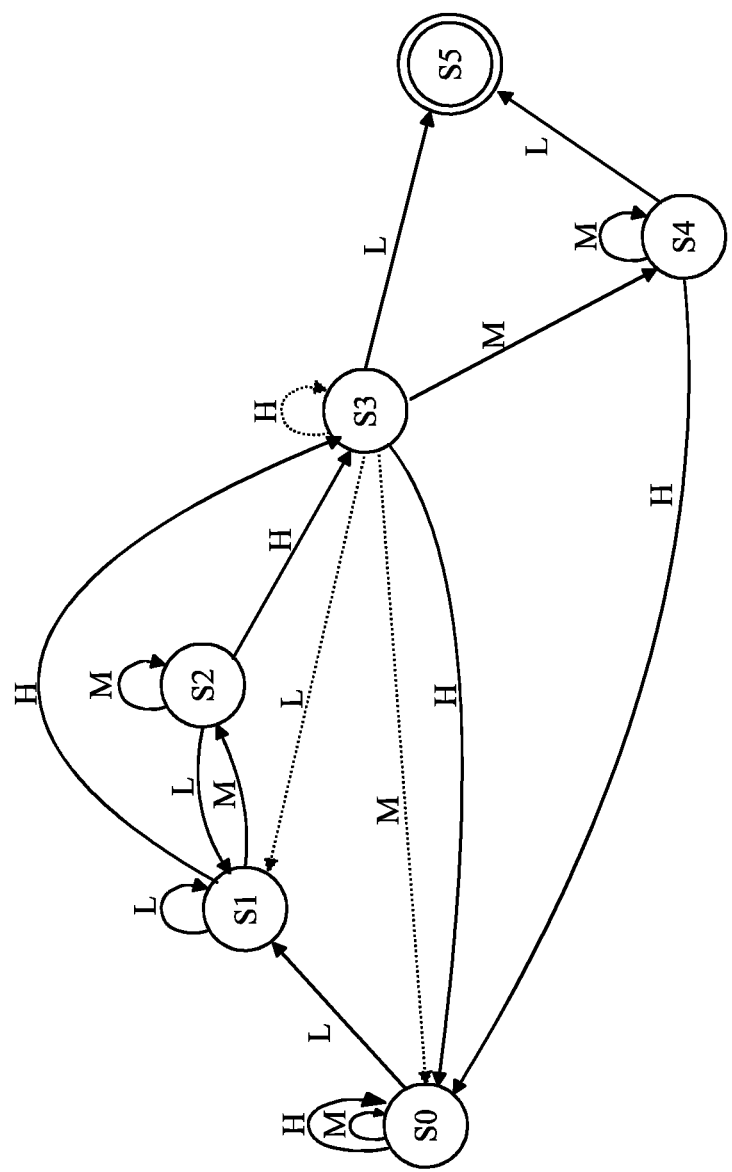
FIG. 3A illustrates the state diagram for a counter extended FSM for detecting the glitch sequence [^L]*L+M*H{m}M*L.

Refer now to FIG. 3A, which illustrates the state diagram for a counter extended FSM for detecting the glitch sequence [^L]*L+M*H{m}M*L. In this embodiment, state S3 references a counter that is initially loaded with the value m−1 when the trigger is armed. Each time S3 is entered in response to an input of H, the counter is decremented by 1. The count satisfied condition for this case is C=0, where C is the count in the associated counter. The next state upon the receipt of a symbol by S3 now depends not only on that symbol, but also on the state of the counter after any decrement operation has been completed. If the count satisfied condition is met, the next state is the state transition shown by the solid line edges leaving S3. If the count satisfied condition is not met, the transitions shown by the dotted edges are taken. A state table for the FSM in FIG. 3A is shown in Table 1 which shows the next state as a function of the current state, input symbol, and whether or not the count satisfied condition has been met. For reasons that will be explained in more detail below, a next state as a function of the counter value is provided even for states that do not reference the counter so that all states have the same format. The next state values for the cases in which the count satisfied condition has not been met are shown in the columns marked "✘". The next state values for the cases in which the count satisfied condition has been met are shown in the columns marked "✓".

TABLE 1

State Table for [^L]*L + M*H{m}M*L.

| | Current state | | | | | | | | | | |
|---|---|---|---|---|---|---|---|---|---|---|---|
| | S0 | | S1 | | S2 | | S3 | | S4 | | S5 (Match) |
| Input | x | ✓ | x | ✓ | x | ✓ | x | ✓ | x | ✓ | x | ✓ |
| L | 1 | | 1 | | 1 | | 1 | | 5 | | 5 | — |
| M | 0 | | 2 | | 2 | | 0 | | 4 | | 4 | — |
| H | 0 | | 3 | | 3 | | 3 | | 0 | | 0 | — |

In the above example, there is only one counter, and hence, the identity of the counter does not need to be shown. However, in many cases of interest, there will be multiple counters. Hence, the identity of the counter corresponding to each state is stored in the state table or an associated table.

Figure 3B:
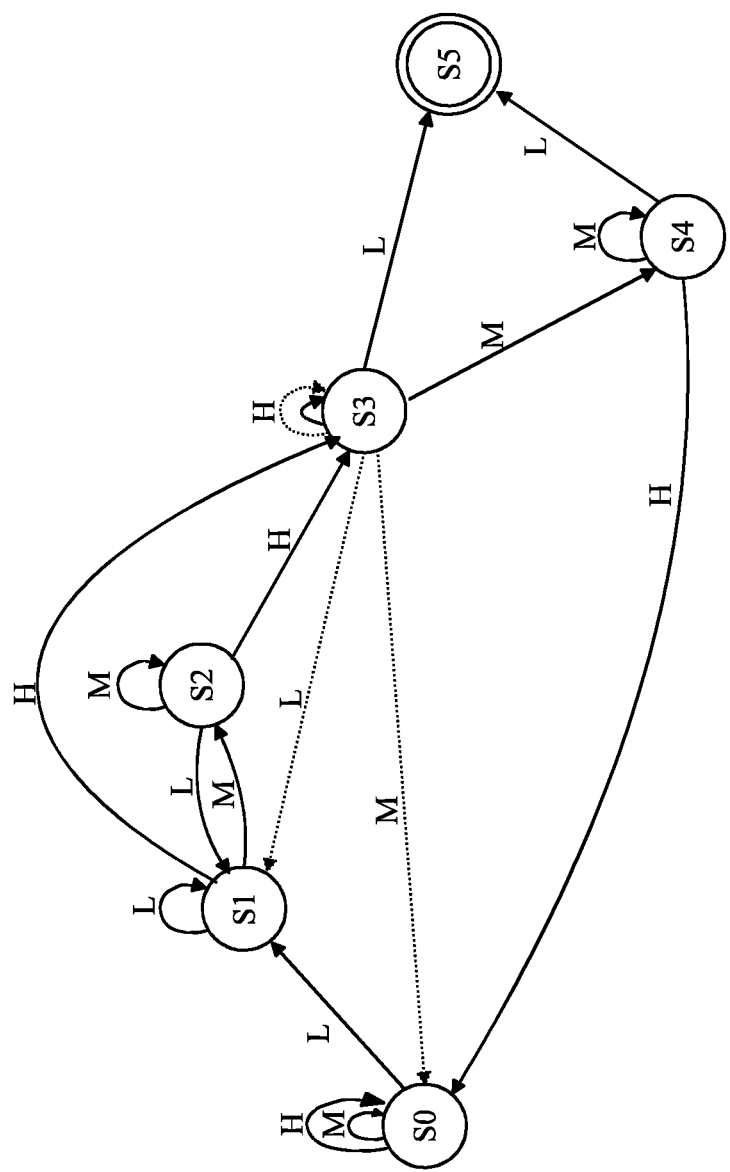
FIG. 3B illustrates the state diagram for a counter extended FSM for detecting the glitch sequence [^L]*L+M*H{m,}M*L.

Refer now to FIG. 3B which illustrates the state diagram for a counter extended FSM for detecting the glitch sequence [^L]*L+M*H{m,}M*L. In this case, the count satisfied condition is that at least m Hs have been received. If the count condition has not been satisfied and an H is received, S3 continues to loop. Once the count satisfied condition has been met, S3 will still loop on receiving an H. Since the pattern requires "at least" m Hs, there can be more; hence, there are two looping transitions shown in the figure.

TABLE 2

State Table for [^L]*L + M*H{m,}M*L.

| | Current state | | | | | | | | | | |
|---|---|---|---|---|---|---|---|---|---|---|---|
| | S0 | | S1 | | S2 | | S3 | | S4 | | S5 (Match) |
| Input | x | ✓ | x | ✓ | x | ✓ | x | ✓ | x | ✓ | x | ✓ |
| L | 1 | | 1 | | 1 | | 1 | | 5 | | 5 | — |
| M | 0 | | 2 | | 2 | | 0 | | 4 | | 4 | — |
| H | 0 | | 3 | | 3 | | 3 | | 3 | | 0 | — |

Figure 3C:
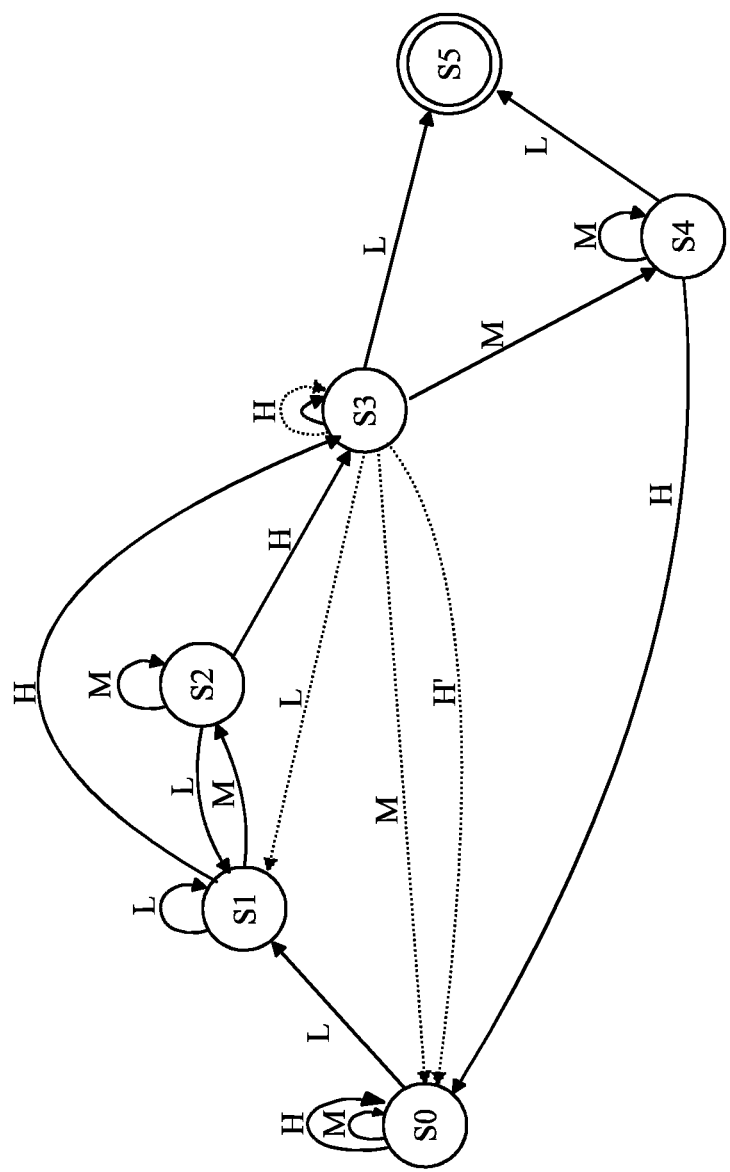
FIG. 3C illustrates a counter extended FSM for the glitch sequence [^L]*L+M*H{m,n}M*L.

The third type of counting style presents additional challenges. Consider the glitch sequence [^L]*L+M*H{m,n}M*L. The count condition is satisfied when the counter value is greater than or equal to m and less than or equal to n. There are two cases in which this condition is not met. The first corresponds to the count being less than m, and the second corresponds to the count being greater than n. If an H is received during the first case, the state loops back to itself and the count is incremented or decremented, as the condition could still be met. In the second case, the FSM returns to S0, i.e., the search failed. During the operation in which the condition is met, an H causes a loop back to S3. Hence, there are three different cases for an H when the FSM is in state S3. Refer now to FIG. 3C, which illustrates a counter extended FSM for the glitch sequence, [^L]*L+M*H{m,n}M*L. If the count is less than m, and an H is received, the count condition is not satisfied and the edge loops back to S3, as shown by the dotted loop on S3. If the count is greater than n, the edge marked H' is taken. If the count is between m and n, the count satisfied condition is met, and an additional H is merely added to the count as indicated by the solid loop back to S3.

These two distinct not satisfied modes could in principle be accommodated by adding a third column to the state table. The determination of which not satisfied column is used would then be determined by a flag that is set on entering S3 the first time and reset on the count being greater than n. As will be explained in more detail below, it is advantageous to use the same format for all columns in the state table. Hence, adding a third column to the state table for the counted states would require adding a third column to the table for all of the states. This would significantly increase the memory required for the state table. As will be discussed in more detail below, minimizing the memory requirement of the state table is important in terms of maximizing the number of symbols that can be processed at each FSM clock cycle. Hence, this method of accommodating the two different not satisfied possibilities is not preferred.

In one aspect of the present invention, the additional column in the state tables is avoided by noting that there are only two "next states" in the table for an H, even though there are three possible cases for S3 when an H is received. The first next state is 0, and the second next state is S3, i.e., a loop back to S3. In this case, two flags are defined. The first indicates whether the count condition is satisfied, the second indicates whether the fail condition corresponds to the count being too low or too high. For the purposes of this example, the second flag will be denoted by f and will be defined to be true if the count is less than m. When the count reaches m, f is set to false. A state table is constructed corresponding to one of the fail conditions, in this case, the flag being true. The next state in this fail case is S3. The other possible next state, S0, is stored in the H row of the condition satisfied column, even though this is not the correct next state for that location in the state table. However, the FSM is programmed to reverse the entries in the condition not satisfied and condition satisfied columns if the flag is true. Hence, when the condition is satisfied, the correct next state, S3, will be used. When the count exceeds n, the flag is reset, and hence, the value in the count satisfied column is used for H, even though the count is not actually satisfied. It should be noted that the state table based on this flag is shown below.

TABLE 3

State Table for [^L]*L + M*H{m, n}M*L.

| | Current state | | | | | | | | | | |
|---|---|---|---|---|---|---|---|---|---|---|---|
| | S0 | | S1 | | S2 | | S3 | | S4 | | S5 (Match) |
| Input | x | ✓ | x | ✓ | x | ✓ | x | ✓ | x | ✓ | x | ✓ |
| L | 1 | | 1 | | 1 | | 1 | | 5 | | 5 | — |
| M | 0 | | 2 | | 2 | | 0 | | 4 | | 4 | — |
| H | 0 | | 3 | | 3 | | 3(f) | | 0(f) | | 0 | — |

It should be noted that the entry for H and the count condition satisfied will never be taken while f is true, hence, the value stored there has no effect on the operation of the FSM. When the count reaches m, f is set to false, and hence the column entries for H are reversed.

In summary, the state tables for any of the three counting styles can be constructed by having at least two columns for the counting state. The choice of column is determined by a first flag that indicates whether the count satisfied condition has been met. In some cases, a second flag that indicates the manner in which the count satisfied condition has not been met is needed. This flag can be used in conjunction with a third column to pick the next state by selecting which of the count condition not satisfied next states is the correct one. In some cases, the third column can be eliminated by using the second flag to reverse the entries in the two column table depending on the manner in which the count condition is not satisfied.

The above-described embodiments allow the counting function to be implemented without significantly increasing the number of states in the FSM. The computational engine needs to have one counter for each counting function in the regular expression that is operative at any given time. In addition, the state table must be expanded to include an entry for each count enhanced state to provide the next state for the two different count possibilities. One provides the next state if the count is satisfied, and one provides the next state if the count has not been satisfied. The above-described embodiments are single trigger FSMs in that once the reporting state is achieved, the trigger stops functioning until it is reset. Embodiments in which the trigger operates in a continuous manner will be discussed in more detail below.

While the above-described embodiments provide improvements over embodiments in which a new state is added for each possible count in a regular expression, these embodiments still only process one symbol per FSM cycle. To provide a significant speed improvement in finding the target sequence, an FSM that processes multiple samples per FSM clock cycle is required.

One method for constructing a state table for a multi-symbol FSM that includes counting states and searches for a sequence that satisfies some predetermined regular expression starts from an FSM that processes one symbol per FSM clock cycle and searches for the sequence in question. Using this one symbol FSM, an intermediate one symbol FSM is constructed by expanding the counting states in the one symbol FSM. This expanded FSM will be referred to as a base FSM for an FSM that processes w symbols at each cycle. The base FSM is a construct that allows one to construct the state table for the multi-symbol FSM.

To generate a base FSM for a multiple symbol input word, the base FSM for a single symbol input word must first be expanded. The expansion introduces additional counted states for each counted state in the single symbol input word FSM. After the expansion, the number of counted states corresponding to a given counted state in the single symbol FSM is equal to the number of symbols in the input word. Each counted state corresponds to a different alignment of the counted symbols within the input word when the counted state is entered.

Figure 4:
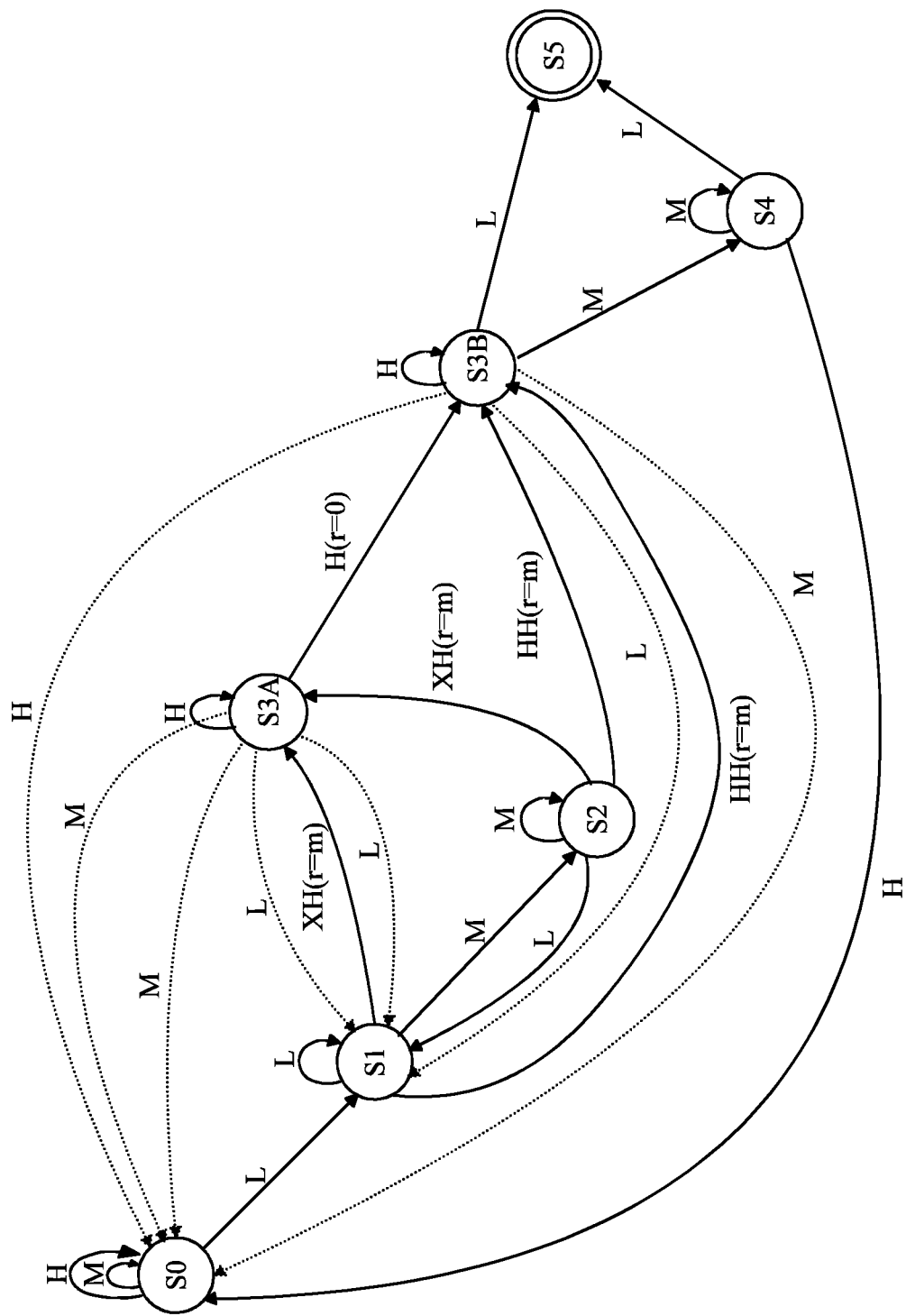
FIG. 4 illustrates a base FSM for a two symbol input word that searches for the sequence shown in FIG. 3A.

Consider a two symbol input word for the sequence shown in FIG. 3A. The base FSM for this case is shown in FIG. 4. State S3 is expanded into two states, S3A and S3B. The state counting H input symbols could be entered in response to an input word XH, or HH, where X is either L or M. State 3A counts H strings that enter via input words of the form XH. This counter will be referred to as the odd count state. State S3B counts H strings that enter via an input word of HH. This state will be referred to as the even count state. Once a given counting state has been entered, there are three possibilities. The next input word could be HX, HH, or XX', where X' can be either L or M. If XX' is received, by either state, the count fails by definition. So only the first two possibilities need to be examined. Consider the case in which HX is received by the odd counter, S3A. The counters in the base FSM each count in units of two. On entry into S3A, the counter is reset to the value corresponding to a count of m, namely m/2−1. This reset operation is indicated by the (r=m) tag on the edge in question. On entering the odd state via an H, one count was in effect registered, even though only one H of the pair has been seen. In essence, the state owes one H to actually complete the count. Hence, the counter will either have just reached the desired count on the last HH input word or it is still in need of processing a further HH to complete the count. In the later case, the fail transition is taken, since the X was received before the desired count was obtained. In the former case, the state table will have an exit transition for the next H. In effect, the H completes the missing symbol from the first pair. Hence, the odd counter will have an output edge on count satisfied for any word of the form HX. State S3B is entered in response to an input word of HH. This counter is likewise reset to the value corresponding to m.

While the base FSM has two counted states, these states can be implemented using a single counter, since only one of the states will be operative at any given time. If two different counters are used, then the counter for state 3B must be reset to zero on entry from the edge connecting S3A to S3B. This guarantees that S3B will not start counting any additional Hs instead of taking the failed edge on another H. If a single counter is used, then the counter that was used for S3A will already have counted down to zero, and hence, no reset is needed.

The manner in which the state table for the multi-symbol FSM is constructed from the base FSM will now be explained in more detail. The number of possible input words for a w symbol wide FSM is $N_s^w$, where $N_s$ is the number of single step symbols. In the current example, 4=2 and $N_s$=3; hence, there are nine possible two symbol input words. For each state and each possible input word, the path starting at the state and traversed by the mini-path represented by that input word is determined with reference to the base FSM. For example, if the current state is S0 and the input word LM is received, the next state will be S2, as the FSM first transitions to S1 on the first symbol and then to S2 on the second symbol. If the FSM is currently at S2 and XH is received, the FSM will transition to S3A and decrement the counter. If on the other hand, HH was received, the FSM would transition to S3B and then decrement the counter.

Refer now to Table 3, which is the state table for the regular expression shown in Table 1 for a word size of two symbols per FSM clock cycle.

TABLE 3

State Table for [^L]*L + M*H{m}M*L with w = 2.

| Input | S0 x | S0 ✓ | S1 x | S1 ✓ | S2 x | S2 ✓ | S3A x | S3A ✓ | S3B x | S3B ✓ | S4 x | S4 ✓ | S5 (Match) x | S5 (Match) ✓ |
|---|---|---|---|---|---|---|---|---|---|---|---|---|---|---|
| LL | 1 | | 1 | | 1 | | 1 | 1 | 1 | | 6 | | 6 | — |
| LM | 2 | | 2 | | 2 | | 2 | 0 | 2 | | 6 | | 6 | — |
| LH | 3 | | 3 | | 3 | | 3 | 0 | 3 | | 6 | | 6 | — |
| ML | 1 | | 1 | | 1 | | 1 | 0 | 1 | | 6 | | 6 | — |
| MM | 0 | | 2 | | 2 | | 0 | 0 | 0 | | 0 | | 5 | — |
| MH | 0 | | 3 | | 3 | | 0 | 0 | 0 | | 0 | | 0 | — |
| HL | 1 | | 1 | | 1 | | 1 | 6 | 1 | | 0 | | 1 | — |
| HM | 0 | | 0 | | 0 | | 0 | 5 | 0 | | 0 | | 0 | — |
| HH | 0 | | 4 | | 4 | | 3 | 0 | 4 | | 0 | | 0 | — |

The above described embodiments refer to a counter whose contents are examined to determine if a count condition has been satisfied. If a single count register is utilized, the register can be incremented until it matches a value stored in another register, e.g., m/w−1. Alternatively, the register can be reset to the desired value and decremented on each clock cycle. This second alternative is preferred because testing the contents of the register for zero can be done more economically.

For counted states of the third type, i.e., {m,n}, a single counter can also be utilized. The counter is first loaded with the value corresponding to m, and the flag that indicates that the count condition has been achieved is set to false. After the counter counts down to zero, the counter is reset to the value corresponding to n, and the flag is set to true. When the counter again counts down to zero, the flag is reset to false.

Alternately, a two register counter could be utilized in which the first register is loaded with a value related to m and the second is loaded with a value related to n. Two flags are used to keep track of whether the count condition is satisfied, and if not, which non-satisfied state is present, i.e., count below the m value or above the n value.

Figure 5:
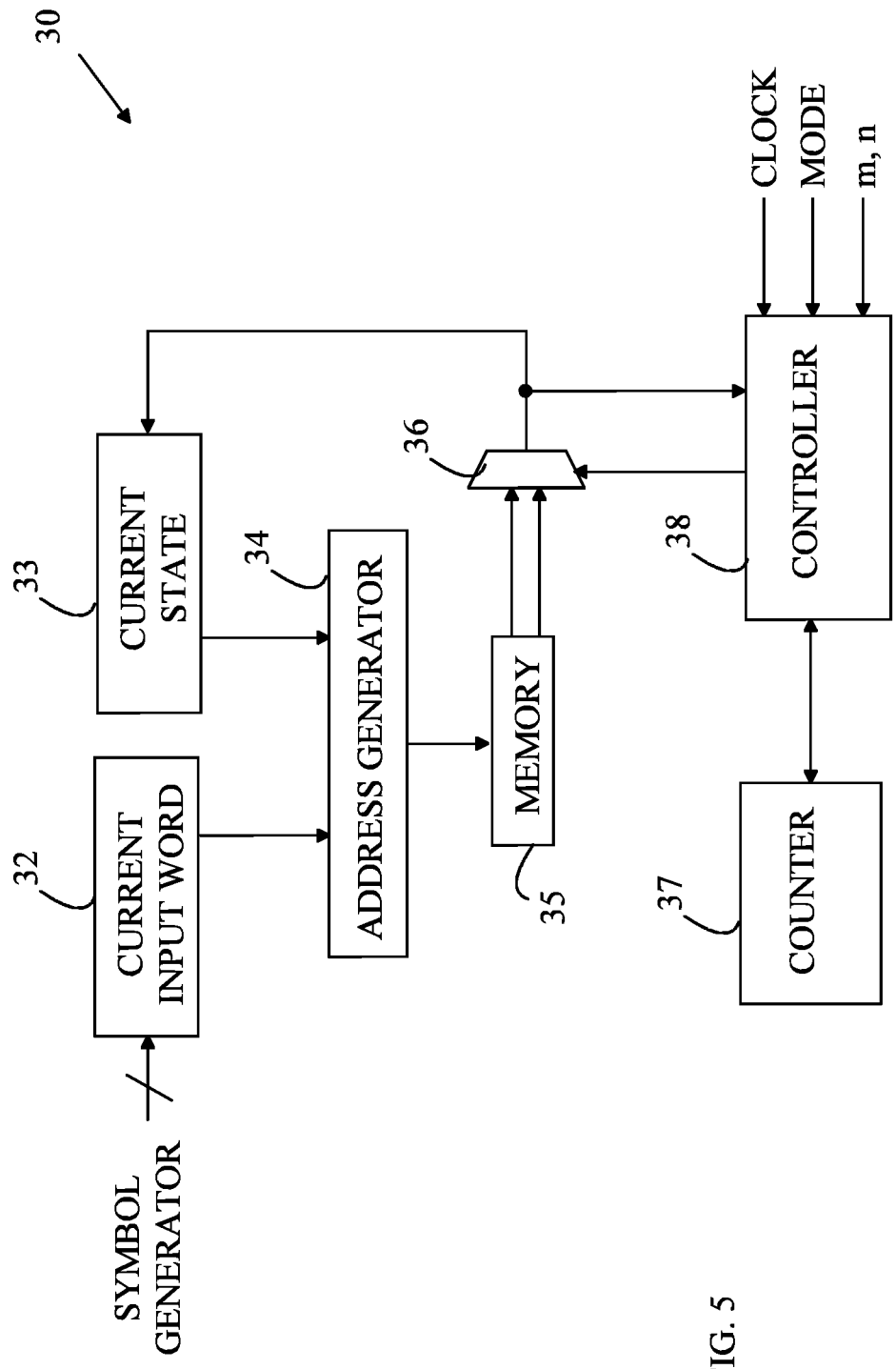
FIG. 5 illustrates the portion of the hardware that implements an FSM according to the present invention.

The present invention is preferably implemented in custom computer hardware to provide the desired speed. Refer now to FIG. 5, which illustrates the portion of the hardware that implements an FSM according to the present invention. The state table for FSM processor 30 is stored in a memory 35 which is loaded by trigger generator 16 shown in FIG. 1. The type of trigger is specified by the user input to trigger generator 16. The symbols of the current word are loaded into a current input word generator 32 which together with the current state of the FSM which is stored in register 33 to determine an address in memory 35 at which the next state values for the count satisfied and count not satisfied entries are located together with any information associated with the next state such as reset values for the counter and flags that determine which of the two entries is to be used. The choice of column is made by controller 38 which generates a selection signal that is input to multiplexer 36 which receives the two possible values.

Controller 38 controls counter 37. Controller 38 receives signals defining the count mode and the values to be loaded into counter 37 when the counter is reset. Controller 38 loads a starting value into counter 37 when required either by the start of the trigger or reset instructions associated with the next state output from multiplexer 36. Counter 37 is decremented on each clock cycle and controller 38 tests the contents of counter 37 to determine if the count stored therein is now zero. Controller 38 also includes the flags discussed above. The first flag determines if the count condition specified by the mode and values of m and n has been satisfied. Controller 38 also sets the second flag needed to process a {m,n} count condition.

As noted above, a trigger generator according to the present invention may include a number of counters. In many cases of interest such as the glitch sequence trigger, a single hardware counter is sufficient, since only one counting state is operating at any time. However, a state table with more than one active counter could be utilized for a particular trigger sequence. In this case, counter 37 would be replaced by a plurality of counters and the current state would specify which counter is to be used for that state transition.

To simplify the address generation, each state in the state table is assigned two next state entries for each possible input word. If the state does not depend on the count in counter 37, both entries are identical. Alternatively, controller 38 can be programmed to take the first of the two entries unless the current state is a counting state. Strategies to remove this redundant information via compression techniques can also be employed.

Refer again to FIG. 1. As noted above, the ADCs 12 operate in banks to achieve the necessary throughput for a high speed instrument. In one aspect of the invention, the symbol generator 15 also includes a bank of symbol generators that create a corresponding group of symbols that become the input symbols to the multi-symbol FSM of the present invention. For example, an instrument having a bank of 16 ADCs generates 16 consecutive time samples each FSM clock cycle. These 16 time samples are then converted to 16 consecutive symbols that are loaded into the input word trigger generator 16. The FSM clock period is set to be less than or equal to the clock in the ADCs in embodiments in which the FSM provides a real time trigger.

To achieve the desired trigger speeds, the number of symbols in an input word must at least match the number of symbols generated by the bank of ADCs in the instrument. The amount of memory needed to store the state table increases exponentially with the number of symbols in the multi-symbol input word to the FSM. Hence, FSM designs that reduce the memory requirements are preferred.

Refer again to the FSM shown in FIG. 3A. With a one symbol input word, the state table for this FSM has three rows and ten columns in embodiments in which each state stores a two entry next symbol value. The corresponding FSM with a 16 symbol input word requires $3^{16}$ rows and 30 columns corresponding to the 15 states. The maximum number of different rows that can be created from the 30 columns is less than $30^2$ or 900, since the four columns are identical for the non-counted states. Hence, the state tables must have a large number of cases in which the row for one input word is the same as the row for another input word with the exception of the input word in the first column. This redundancy can be used to reduce the size of the memory needed by storing a reduced table that has only the unique rows with the input word replaced by a key value. A correspondence table that stores the correspondence between the input words and the key values is then used to access the reduced table. The correspondence table has one column that is indexed by the input word. Hence, this compressed version of the state table reduces the memory requirements by roughly a factor of 30 at the expense of a table lookup that is performed in address generator 34 shown in FIG. 5.

This form of table compression is particularly well suited to the type of state table generated by multi-symbol FSMs. However, other forms of table compression could also be utilized to further reduce the size of the state table.

The above-described embodiments of the present invention utilize Moore FSMs in which the FSM stops when a match is found. In a Moore FSM, the output values are determined solely by the current state of the FSM. That is, the FSM reports a match when it enters a state no matter how it got to that state. In a Mealy machine, the output depends on the current state and the current inputs. Hence, a Mealy machine reports on a particular edge being taken. In a Mealy machine, a state may report a match if entered by one edge, but not if entered by another edge. Mealy machines can also be used for implementing the present invention. For triggers in which the trigger is to operate continually without resetting, a Mealy FSM is preferred. First, a non-stopping trigger can have transitioned through a matching state on a w-symbol path, while reporting on the edge that passes through the matching state. Secondly, the Mealy machine is more compact. Third, a Mealy machine can be made to match and return to the start state all in one transition. For example, in a Moore machine which repeats S5 is both a match state and the next pass through the start state, which is not ideal.

In a Mealy FSM embodiment of the present invention, the edges carry the information about incrementing counters and whether a match has occurred instead of associating this information with entering a particular state. The Mealy FSM embodiments are also generated from a base FSM. Each state of the multi-symbol FSM corresponds to a w-symbol path within the base FSM. An intermediate stop on that path may trigger a count operation or match report. Hence, the two edges that terminate on the same state in the base FSM can correspond to different counting and reporting behaviors even though the two paths end on the same state.

Figure 6:
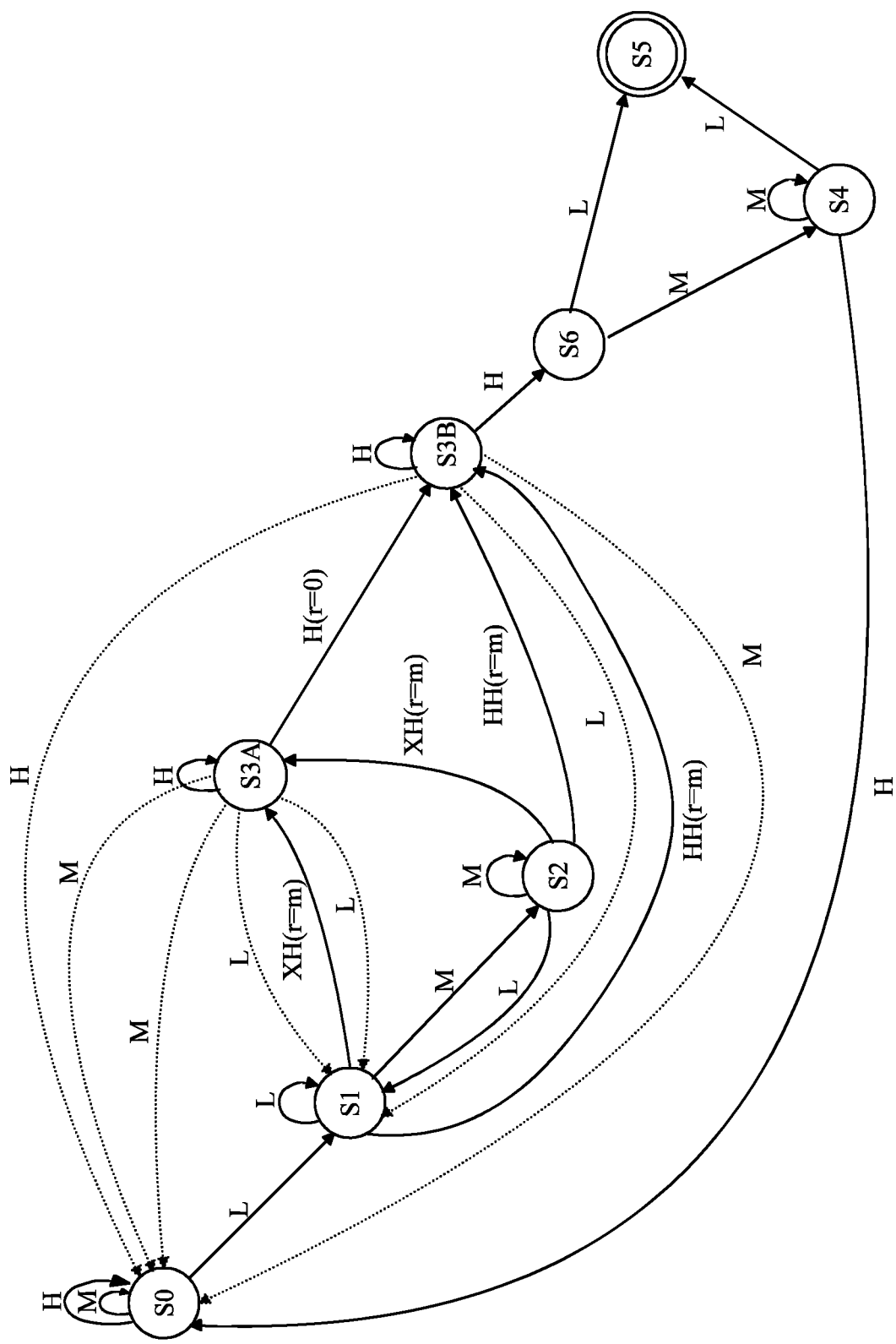
FIG. 6 illustrates a base FSM for a two symbol input word FSM that counts an odd number of Hs.

As noted above, a multi-symbol FSM counting state counts in units of the word size. That is m and n must be divisible by the word size w, and the counters are incremented or decremented by w. If an m or n value that is not a multiple of w is desired, the state table can be augmented to include the appropriate number of additional states that consume the needed symbols. The state table can be constructed from a base FSM by inserting one or more additional states that are entered on the receipt of another symbol of the type being counted. Refer now to FIG. 6, which illustrates a base FSM for a two symbol input word FSM that counts an odd number of Hs. The base FSM is obtained by adding the state S6 after state S3B. Hence, one additional H must be received before the trigger fires. Alternatively, the additional states could be added before S3A and/or after S3A. For an {m,} counter, the extra states are added before S3A. For an {m,n} counter, the states may have to be added both before S3A and after S3B depending upon the required values of m and n. For values of n which are smaller than m plus w additional symbols then additional states can also be utilized instead of the second counter to construct an FSM that counts correctly, for example between values of m=33 and n=35 on a four symbol per clock FSM.

The FSM of the present invention is preferably implemented in special purpose hardware to provide the speed needed to implement a real-time trigger for a high speed oscilloscope or similar instrument. However, embodiments could be implemented on general purpose data processing systems if the speed of the incoming data stream was sufficiently low.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
an input adapted to receive an ordered sequence of digital signal values, each digital signal value being characterized by a maximum number of signal value states;
a symbol generator that receives said ordered sequence of digital signal values and converts said ordered sequence of digital signal values into an ordered sequence of symbols, each symbol having a plurality of states, each of said symbols being characterized by a maximum possible number of symbol states that is less than said maximum number of signal value states; and
a trigger generator comprising a finite state machine (FSM) and a counter, said FSM receiving said ordered sequence of symbols and generating a match signal when said ordered sequence of symbols includes a target sequence specified by a regular expression that includes a counting limitation for one of said symbols, wherein
instances of said one of said symbols are counted in said counter, said FSM comprising a first register that stores a current input word to said FSM, a second register that stores a current state for said FSM, a memory that stores a state table for said FSM, an address generator that specifies an address in said memory, said memory providing two next state values based on said address, and a controller that selects one of said next state values depending on a count in said counter.

2. The apparatus of claim 1 wherein said FSM is characterized by an FSM clock period, and wherein said FSM processes said input word during each FSM clock period, said input word comprising a plurality of said symbols.

3. The apparatus of claim 1 wherein said counting limitation comprises a requirement that a precise number of instances of one of said symbol states be present in said target sequence.

4. The apparatus of claim 1 wherein said counting limitation comprises a requirement that more than a specified number of instances of one of said symbol states be present in said target sequence.

5. The apparatus of claim 1 wherein said counting limitation comprises a requirement that more than a first specified number of said instances of one of said symbol states and less than a second specified number of said instances of said one of said symbols be present in said target sequence.

6. The apparatus of claim 1 wherein said state table specifies first and second next states for said FSM when said FSM is in said counting state, said controller choosing one of said first and second next states based on whether said counting limitation has been satisfied.

7. The apparatus of claim 6 wherein said counting limitation is not satisfied if when said counter has a value less than a first value or greater than a second value, and wherein said one of said first and second next states that said FSM chooses also depends on whether said counter is less than said first value or greater than said second value.

8. The apparatus of claim 1 further comprising a signal digitizer and a signal memory, said signal digitizer receiving a signal and generating said ordered sequence of signal values therefrom, said ordered sequence of signal values being stored in said signal memory.

9. The apparatus of claim 8 wherein said signal digitizer generates a first number of signal values during each FSM clock period, each of said first number of signal values being converted to a corresponding symbol during one FSM clock period, and wherein said FSM processes said corresponding symbols as a single input word during one FSM clock period.

10. The apparatus of claim 8 further comprising a display controller and a display, said display controller displaying a portion of said signal values on said display in response to said FSM generating said match signal.

11. The apparatus of claim 1 wherein said FSM is a Mealy FSM.

12. A method for operating a data processing system to detect a signal pattern in a signal comprising an ordered sequence of signal values, characterized by a maximum number of states that each signal value can assume, said method comprising:
converting said ordered sequence of signal values into an ordered sequence of symbols, each symbol having a plurality of states, and being characterized by a maximum number of symbol values that is less than said maximum number of states that each signal value can assume; and
implementing an FSM and a counter in said data processing system, said FSM receiving said ordered sequence of symbols and generating a match signal when said ordered sequence of symbols includes a target sequence specified by a regular expression that includes a counting limitation for one of said symbols, wherein said counter counts instances of said one of said symbols wherein said FSM comprises a first register that stores a current input word to said FSM, a second register that stores a current state for said FSM, a memory that stores a state table for said FSM, an address generator that specifies an address in said memory, said memory providing two next state values based on said address, and a controller that selects one of said next state values depending on a count in said counter.

13. The method of claim 12 wherein said FSM is characterized by an input word and an FSM clock period, and wherein said FSM processes said input word during each FSM clock period, said input word comprising a plurality of said symbols.

14. The method of claim 12 wherein said counting limitation comprises a requirement that a precise number of instances of one of said symbol states be present in said target sequence.

15. The method of claim 12 wherein said counting limitation comprises a requirement that more than a specified number of instances of one of said symbol states be present in said target sequence.

16. The method of claim 12 wherein said counting limitation comprises a requirement that more than a first specified number of said instances of one of said symbol states and less than a second specified number of said instances of said one of said symbols be present in said target sequence.

17. The method of claim 12 wherein said state table specifying first and second next states for said FSM when said FSM is in said counting state, said FSM choosing one of said first and second next states based on whether said counting limitation has been satisfied.

18. The method of claim 17 wherein said counting limitation is not satisfied when said counter has a value less than a first value or greater than a second value, and wherein said one of said first and second next states that said FSM chooses also depends on whether said counter is less than said first value or greater than said second value.

19. The method of claim 12 further comprising a signal digitizer and a signal memory, said signal digitizer receiving a signal and generating said ordered sequence of signal values therefrom, said ordered sequence of signal values being stored in said signal memory.

20. The method of claim 19 wherein said signal digitizer generates a plurality of signal values during each FSM clock period, each of said plurality of signal values being converted to a corresponding symbol during one FSM clock period, and wherein said FSM processes said corresponding symbols as a single input word during one FSM clock period.

* * * * *

UNITED STATES PATENT AND TRADEMARK OFFICE
CERTIFICATE OF CORRECTION

PATENT NO. : 10,908,184 B2  
APPLICATION NO. : 16/248642  
DATED : February 2, 2021  
INVENTOR(S) : Andrew Lehane et al.

Page 1 of 1

It is certified that error appears in the above-identified patent and that said Letters Patent is hereby corrected as shown below:

In the Claims

In Column 14, Line 31, in Claim 7, before "when" delete "if".

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*